(12) United States Patent
Zhang

(10) Patent No.: US 9,368,062 B2
(45) Date of Patent: Jun. 14, 2016

(54) DISPLAY PANEL DISPLAY DEVICE INCLUDING THE DISPLAY PANEL AND METHOD FOR DRIVING THE DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/369,462

(22) PCT Filed: Dec. 9, 2013

(86) PCT No.: PCT/CN2013/088861
§ 371 (c)(1),
(2) Date: Jun. 27, 2014

(87) PCT Pub. No.: WO2015/018153
PCT Pub. Date: Feb. 12, 2015

(65) Prior Publication Data
US 2015/0077447 A1    Mar. 19, 2015

(30) Foreign Application Priority Data
Aug. 9, 2013 (CN) .......................... 2013 1 0347555

(51) Int. Cl.
G09G 3/30 (2006.01)
G09G 3/32 (2016.01)
(Continued)

(52) U.S. Cl.
CPC .............. G09G 3/3225 (2013.01); G02F 1/167 (2013.01); G09G 3/344 (2013.01);
(Continued)

(58) Field of Classification Search
CPC ....................................................... G09G 3/344
USPC ...................................................... 345/76, 77
See application file for complete search history.

(56) References Cited

U.S. PATENT DOCUMENTS

2002/0043941 A1* 4/2002 Iketsu et al. ................ 315/169.3
2002/0167472 A1* 11/2002 Jinno .............................. 345/76

(Continued)

FOREIGN PATENT DOCUMENTS

CN    1482585 A    3/2004
CN    1714380 A    12/2005

(Continued)

OTHER PUBLICATIONS

International Search Report prepared Apr. 18, 2014 of corresponding PCT/cn2013/088861.

(Continued)

*Primary Examiner* — Roy Rabindranath
(74) *Attorney, Agent, or Firm* — Nath, Goldberg & Meyer; Joshua B. Goldberg; Leonid D. Thenor

(57) ABSTRACT

The embodiment of the present invention discloses a display panel, a method for driving the display panel and a display device provided with the display panel, which belong to the field of display technology and solve the technical problems that the existing AMOLED has relatively high power consumption and thus has difficulty in meeting current energy-saving requirements on the display panel. The display panel includes a plurality of pixel units arranged in an array and each pixel unit includes at least one OLED sub-pixel and at least one EPD sub-pixel. The present invention can be applied in scenes such as a transparent window and a refrigerator door.

18 Claims, 2 Drawing Sheets

(51) Int. Cl.
*G02F 1/167* (2006.01)
*G09G 3/34* (2006.01)
*H01L 27/32* (2006.01)
*H01L 51/52* (2006.01)

(52) U.S. Cl.
CPC ....... *H01L 27/3213* (2013.01); *H01L 51/5206* (2013.01); *H01L 51/5234* (2013.01); *G02F 2201/44* (2013.01); *G02F 2201/52* (2013.01); *G09G 2300/046* (2013.01); *G09G 2300/0452* (2013.01); *G09G 2330/021* (2013.01); *G09G 2330/023* (2013.01); *H01L 27/3232* (2013.01)

(56) References Cited

U.S. PATENT DOCUMENTS

| | | | |
|---|---|---|---|
| 2007/0001956 | A1 | 1/2007 | Yeh et al. |
| 2008/0024430 | A1* | 1/2008 | Roh ............... 345/107 |
| 2011/0115769 | A1 | 5/2011 | Hsieh et al. |
| 2011/0176079 | A1 | 7/2011 | Kung et al. |
| 2011/0285610 | A1 | 11/2011 | Yan et al. |
| 2012/0218242 | A1* | 8/2012 | Ho et al. ............. 345/211 |
| 2013/0162612 | A1* | 6/2013 | Chuang ............ 345/208 |

FOREIGN PATENT DOCUMENTS

| | | |
|---|---|---|
| CN | 1963612 A | 5/2007 |
| CN | 101169910 A | 4/2008 |
| CN | 101778725 A | 7/2010 |
| CN | 101813865 A | 8/2010 |
| CN | 102651383 A | 8/2012 |
| CN | 102655219 A | 9/2012 |
| CN | 102708807 A | 10/2012 |
| CN | 102890906 A | 1/2013 |
| CN | 103187026 A | 7/2013 |
| KR | 20090073903 A | 7/2009 |
| KR | 1020090073903 A | 7/2009 |

OTHER PUBLICATIONS

Written Opinion of the International Searching Authority dated May 14, 2014 issued in corresponding International Application No. PCT/CN2013/088861.

Chinese Office Action dated Jul. 22, 2015 issued in corresponding Chinese Application No. 201310347555.9.

* cited by examiner

DISPLAY PANEL DISPLAY DEVICE INCLUDING THE DISPLAY PANEL AND METHOD FOR DRIVING THE DISPLAY PANEL

This is a National Phase Application filed under 35 U.S.C. 371 as a national stage of PCT/CN2013/088861, filed Dec. 9, 2013, claiming priority from Chinese Application No. 201310347555.9 filed Aug. 9, 2013, the content of each of which is hereby incorporated by reference in its entirety.

FIELD OF THE INVENTION

The present invention relates to the field of display technology, and particularly to a display panel, a method for driving the display panel, and a display device including the display panel.

BACKGROUND OF THE INVENTION

With the continuous development of display technology, an active matrix organic light-emitting diode panel (AMOLED in abbreviation) with advantages such as low production cost, wide viewing angle, fast response has gradually replaced the traditional liquid crystal display. An organic light-emitting diode (OLED in abbreviation) is driven by current, and the working principle thereof lies in the fact that electrons and holes are combined to produce light emission, that is, electrical energy is directly converted into light energy, so the AMOLED is a self-luminous display device.

On the other hand, nowadays, the global climate is becoming warm, a low-carbon lifestyle with energy saving is an important topic which is discussed all over the world. However, the inventor has found that the existing AMOLED belongs to the self-luminous display device, the energy consumption of which is high, so it is difficult to meet the energy-saving requirements on a display device.

SUMMARY OF THE INVENTION

Embodiments of the present invention provide a display panel, a method for driving the display panel and a display device provided with the display panel, which can solve the technical problem that the existing AMOLED has relatively high power consumption and thus it is difficult to meet the energy-saving requirements on the display device currently.

In order to achieve the above object, an embodiment of the present invention employs the following technical solutions.

The present invention provides a display panel, including a plurality of pixel units arranged in an array, wherein each pixel unit includes at least one OLED sub-pixel and at least one electrophoretic display sub-pixel.

Further, each pixel unit includes three OLED sub-pixels and one electrophoretic display sub-pixel.

Preferably, the three OLED sub-pixels and the one electrophoretic display sub-pixel are arranged in a square or arranged in a straight line.

Further, the OLED sub-pixel includes an anode, a hole transport layer, a light emitting layer, an electron transport layer and a cathode which are stacked sequentially.

Further, at least one of the anode and the cathode is made from a transparent conductive material.

Further, the EPD sub-pixel includes a first electrode, a second electrode and a micro-capsule or a micro-cup disposed between the first electrode and a second electrode.

Further, the display panel includes an upper substrate and a lower substrate, wherein the plurality of pixel units arranged in an array are provided between the upper substrate and the lower substrate, and at least one of the upper substrate and the lower substrate is a flexible transparent substrate.

Preferably, the three OLED sub-pixels of the pixel unit are a red OLED sub-pixel, a green OLED sub-pixel and a blue OLED sub-pixel respectively; and the one EPD sub-pixel of the pixel unit is a black-and-white EPD sub-pixel.

The present invention further provides a display device including the above display panel.

Preferably, the display device is further provided with a light source for supplying light to the at least one EPD sub-pixel when the external light is weak.

The present invention further provides a method for driving the above display panel, including:

determining a color to be displayed by a pixel unit; if the color to be displayed by the pixel unit is the same as that of the EPD sub-pixel, driving the at least one EPD sub-pixel to display; otherwise, driving the at least one OLED sub-pixel to display.

In the case that each pixel unit of the display panel includes three OLED sub-pixels and one EPD sub-pixel, and the three OLED sub-pixels are a red OLED sub-pixel, a green OLED sub-pixel and a blue OLED sub-pixel, respectively, and the one EPD sub-pixel is a black-and-white EPD sub-pixel, the step of determining a color to be displayed by a pixel unit includes:

acquiring three gray values of respective red, green and blue components of the color to be displayed by the pixel unit;

if two of the three gray values are different, determining that the color to be displayed by the pixel unit is a color other than black and white;

if all of the three gray values are identical, determining that the color to be displayed by the pixel unit is black-and-white.

Further, when the color to be displayed by the pixel unit is the color other than black and white, driving the EPD sub-pixel to display in black-and-white while driving the red OLED sub-pixel, the green OLED sub-pixel and the blue OLED sub-pixel to display; and when the color to be displayed by the pixel unit is black-and-white, driving the EPD sub-pixel to display without driving the three OLED sub-pixels.

Compared with the prior art, the above technical solutions provided by the present invention have following advantages: in the display panel provided by the present invention, one pixel unit includes at least one OLED sub-pixel and at least one EPD sub-pixel. The EPD sub-pixel is usually used in the Electronic Paper (E-paper in abbreviation), and displays a black-and-white image by reflecting the ambient light without using a backlight, and moreover the EPD sub-pixel can maintain the previously displayed gray level without being powered continuously. Compared with the OLED sub-pixel, the EPD sub-pixel has relatively low power consumption. When an image is displayed by the display panel provided by the present invention, if one part of the image is a color image and the other part of the image is a black-and-white image, the color image can be displayed by the OLED sub-pixels of pixel units corresponding to the one part of the image; and the black-and-white image can be displayed by the EPD sub-pixels of pixel units corresponding to the other part of the image. If the entire image is a black-and-white image, it can be displayed by the EPD sub-pixels of the pixel units. Thus, the display panel and the method for driving the display panel provided by the present invention can use the EPD sub-pixels with relatively low power consumption to display the black-and-white part in the image to be displayed and not all of the OLED sub-pixels with relatively high power consumption are required to display the entire image, thereby the power consumption in display may be reduced and the current energy-saving requirements on the display panel may be met.

BRIEF DESCRIPTION OF THE DRAWINGS

In order to describe the technical solutions in the embodiments of the present invention more clearly, drawings used in describing the embodiments will be introduced briefly.

DETAILED DESCRIPTION OF THE INVENTION

Hereinafter, the technical solutions in the embodiments of the present invention will be described clearly and thoroughly in conjunction with the drawings in the embodiments of the present invention.

Figure 1:
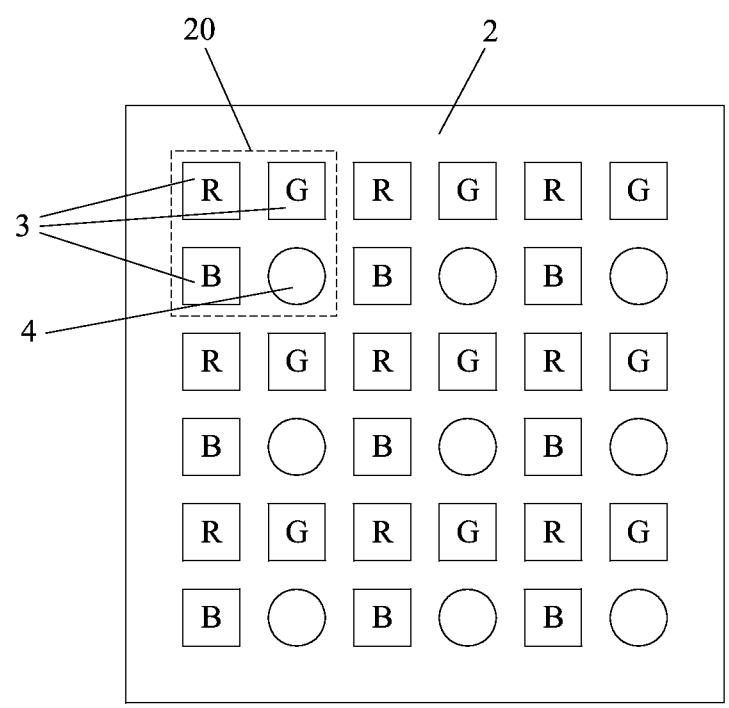
FIG. 1 is a planar view of a display panel provided by an embodiment of the present invention.
Figure 2:
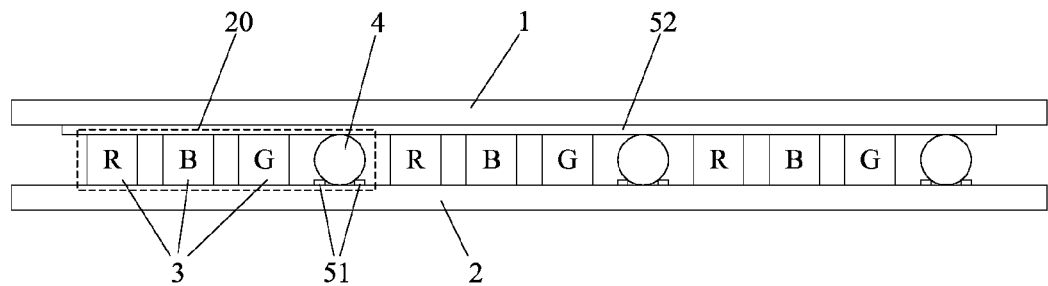
FIG. 2 is a cross-sectional view of the display panel provided by the embodiment of the present invention.

As shown in FIGS. 1 and 2, the display panel provided by the embodiment of the present invention includes a plurality of pixel units 20 arranged in an array, and each pixel unit 20 includes at least one OLED sub-pixel 3 and at least one electrophoretic display (EPD in abbreviation) sub-pixel 4. In the embodiment, each pixel unit 20 includes three OLED sub-pixels 3 and one EPD sub-pixel 4, and the three OLED sub-pixels 3 are a red (R) OLED sub-pixel, a green (G) OLED sub-pixel, and a blue (B) OLED sub-pixel, respectively. That is, in the embodiment, the commonly used red, green and blue OLED sub-pixels are described as an example of the three OLED sub-pixels and a black-and-white EPD sub-pixel is described as an example of the EPD sub-pixel 4. In other embodiments, OLED sub-pixels of other three colors may be selected to use, or alternatively a white (W) OLED sub-pixel or a yellow (Y) OLED sub-pixel may be selected as the OLED sub-pixel of the fourth color. In the embodiment, one pixel unit consisting of three OLED sub-pixels and one EPD sub-pixel is described as an example. In other embodiments, one pixel unit may be constituted by three OLED sub-pixels and three EPD sub-pixels. The number of the OLED sub-pixels and the number of the EPD sub-pixels of the pixel unit are not limited in the present invention, as long as the pixel unit includes at least one OLED sub-pixel and at least one EPD sub-pixel.

Figure 3:
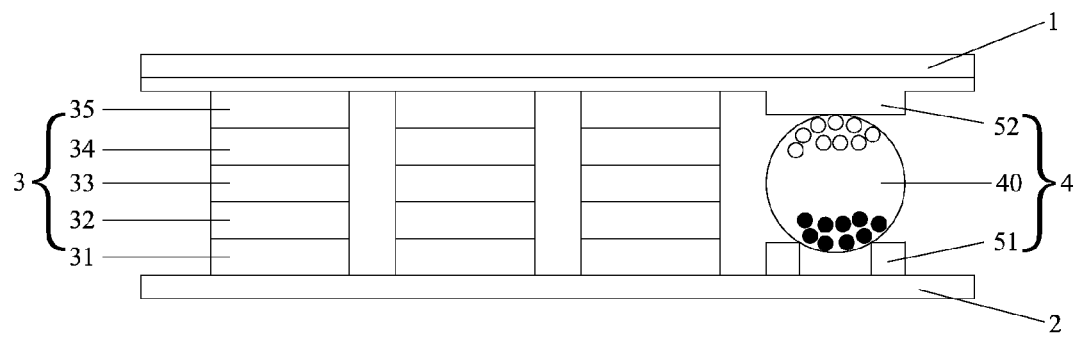
FIG. 3 is another cross-sectional view of the display panel provided by the embodiment of the present invention.

As shown in FIG. 3, each OLED sub-pixel 3 includes an anode 31, a hole transport layer 32, a light emitting layer 33, an electron transport layer 34 and a cathode 35 which are stacked sequentially, and at least one thin film transistor (not shown in the Figure) for driving the OLED sub-pixel 3. The OLED sub-pixel 3 may further include a light emitting auxiliary layer such as a hole injection layer, an electron injection layer, a hole blocking layer, and an electron blocking layer; and an optical auxiliary layer such as a light scattering layer and a light outputting enhancement layer. Each EPD sub-pixel 4 includes a first electrode 51, a second electrode 52, and a micro-capsule 40 disposed between the first electrode 51 and the second electrode 52, there is oil solution containing white charged particles and black charged particles inside the micro-capsule 40, the first electrode 51 and the second electrode 52 cooperate to drive the EPD sub-pixel 4. In other embodiments, the EPD sub-pixel 4 may also be an EPD sub-pixel in a micro-cup form or in any other form.

The three OLED sub-pixels 3 and the one EPD sub-pixel 4 may be arranged in a square (as shown in FIG. 1) or arranged in a straight line (as shown in FIG. 2). Of course, in other embodiments, the three OLED sub-pixels and the one EPD sub-pixel may be arranged in a diamond or in any other form according to actual requirements. Shapes and sizes of the OLED sub-pixels and those of the EPD sub-pixel are not limited in the present invention, the OLED sub-pixel or the EPD sub-pixel may be of square, rectangular, triangular or of any other shape, and the size of the OLED sub-pixel may be the same as or different from that of the EPD sub-pixel. Arrangements of the at least one OLED sub-pixel and the at least one EPD sub-pixel of the pixel unit are based on the numbers and sizes of the sub-pixels, and the at least one OLED sub-pixel and the at least one EPD sub-pixel may be arranged in a square or in a straight line, or may be arranged in any other form such as triangle, hexagon and diamond.

In the display panel provided by the embodiment of the present invention, one pixel unit 20 includes three OLED sub-pixels 3 of different colors and one EPD sub-pixel 4. The EPD sub-pixel 4 is usually used in the Electronic Paper (abbreviated to E-paper), and displays a black-and-white image by reflecting the ambient light without using a backlight, and moreover the EPD sub-pixel can maintain the previously displayed gray level without being powered continuously. Compared with the OLED sub-pixel 3, the EPD sub-pixel has relatively low power consumption.

When an image is displayed by the display panel provided by the embodiment of the present invention, one part of the image is a color image and the other part of the image is a black-and-white image, for example, the image to be displayed is text with color illustrations, then the illustrations is the color image and the remaining text is the black-and-white image. The color image may be displayed by the OLED sub-pixels 3 of one part of pixel units 20 corresponding to the one part of the image, and the EPD sub-pixels 4 in the one part of pixel units 20 display in black in order not to affect the display effect of the OLED sub-pixels 3, and moreover during the continuous color display, the EPD sub-pixels 4 can be maintained in a black-and-white display state without being powered continuously; of course, the EPD sub-pixels 4 in the one part of pixel units 20 may also display in white. The black-and-white image may be displayed by the EPD sub-pixels 4 in the one part of the pixel units 20, while the OLED sub-pixels 3 display in black without being driven, which will not affect the display of the EPD sub-pixels 4. If the entire image is a black-and-white image, the entire image may be displayed by the EPD sub-pixels 4 of the pixel units 20.

Therefore, the display panel provided by the embodiment of the present invention can use the EPD sub-pixels with relatively low power consumption to display the black-and-white part of an image, and thus not all of the OLED sub-pixels with relatively high power consumption are needed to perform the display, so the power consumption used in display may be reduced so as to meet the current energy-saving requirements on the display panel.

Of course, if it is at night or in any other external environment with low light, the black-and-white part of the image may be displayed by the OLED sub-pixels 3 of the one part of pixel units 20.

In addition, the at least one EPD sub-pixel in the pixel unit may be one or more color EPD sub-pixels, and when the color to be displayed by the pixel unit is the same as that of an EPD sub-pixel in the pixel unit, the EPD sub-pixel may be used to perform display without driving the OLED sub-pixel, thus reducing power consumption in display.

Further, as shown in FIGS. 2 and 3, the display panel provided by the embodiment of the present invention includes an upper substrate 1 and a lower substrate 2, and a plurality of pixel units 20 arranged in an array are disposed between the upper substrate 1 and the lower substrate 2. The OLED sub-pixel 3 is disposed on the lower substrate 2; a first electrode 51 of the EPD sub-pixel 4 is disposed on the lower substrate 2 and a second electrode 52 of the EPD sub-pixel 4 is disposed on the upper substrate 1. The upper and lower substrates are base substrates which do not include any other layer or element formed thereon.

In a preferable embodiment, the upper substrate 1 or the lower substrate 2 of the display panel may be a transparent substrate, that is, the display panel is a transparent display panel to be used in a scene such as a transparent window, a transparent refrigerator door. Further, both an anode 31 and a cathode 35 of the OLED sub-pixel 3 are made of a transparent conductive material so that the OLED sub-pixel 3 is light-transmissive. When an image is displayed by the OLED sub-pixels 3 in the pixel unit 20, since the OLED sub-pixels 3 also exhibit a certain transmittance of light, things behind the display panel can be seen through the displayed image; when the EPD sub-pixel 4 in the pixel unit 20 performs display, the OLED sub-pixels 3 does not display in color, so that things behind the display panel can be seen more clearly through the displayed image. Of course, in consideration of production cost and the difficulty in obtaining raw materials, the anode 31 and the cathode 35 of the OLED sub-pixel 3 may be made of a semi-transparent material with relatively low transmittance, and usually the anode may be made of a completely transparent conductive material and the cathode may be made of a semi-transparent conductive material.

Preferably, both the upper substrate 1 and the lower substrate 2 of the display panel are flexible transparent substrates, that is, the display panel is a flexible display panel with bendable characteristics so as to facilitate the use of the display panel in the scene such as a non-planar window or glass door.

The method for fabricating the display panel includes a step of fabricating layers and elements on the lower substrate and a step of fabricating layers and elements on the upper substrate.

The step of fabricating layers and elements on the lower substrate includes steps of firstly forming gate lines, data lines and thin film transistors (TFT) corresponding to each OLED sub-pixel on the lower substrate and then sequentially forming an anode, a hole transport layer, a light emitting layer, an electron transport layer and a cathode of each OLED sub-pixel. Then, first electrodes corresponding to each EPD sub-pixel respectively are formed on the lower substrate and the EPD sub-pixels are then formed. The first electrode of the EPD sub-pixel and the anode of the OLED sub-pixel may be formed simultaneously.

The step of forming layers and elements on the upper substrate includes a step of forming second electrodes corresponding to each EPD sub-pixel respectively. Since the second electrode is transparent, after a layer of the second electrode is deposited on the upper substrate, it is not required to etch the layer of the second electrode to leave the second electrode above the OLED sub-pixels, which will not affect the display effect of the OLED sub-pixels.

Then, the upper substrate formed with layers and elements and the lower substrate formed with layers and elements are aligned and assembled, and a plurality of pixel units arranged in an array are disposed between the upper substrate and the lower substrate.

An embodiment of the present invention further provides a method for driving the above display panel, including the following steps:

S01: determining a color to be displayed by a pixel unit; and

S02: if the color to be displayed by the pixel unit is the same as that of the at least one EPD sub-pixel, driving the at least one EPD sub-pixel to display; otherwise, driving the at least one OLED sub-pixel to display.

When the EPD sub-pixels included in the display panel are black-and-white EPD sub-pixels, the method for driving the display panel according to the present invention includes the following steps:

S1: deciding a color to be displayed by the pixel unit, i.e. determining the image to be displayed by the pixel unit is a color image or a black-and-white image, which step including:

S11: acquiring three gray values of respective red, green and blue components of the color to be displayed by the pixel unit. Since any color can be generated by combining red, green and blue components with different gray values, the combined color can be decided by the gray values of respective red, green and blue components;

S12: if two of the three gray values are different, determining that the color to be displayed by the pixel unit is a color other than black and white;

S13: if all the three gray values are identical, determining that the color to be displayed by the pixel unit is black-and-white, including black, white or grey with different grayscale.

In other embodiments, if OLED sub-pixels in the pixel unit are of other three colors other than red, green and blue or more than three colors, respective gray values of the other three colors other than red, green and blue or the more than three colors should be acquired to determine the color to be displayed based on the ratio among their respective gray values.

S2: if the color to be displayed by the pixel unit is a color other than black and white, driving the OLED sub-pixels of red, green and blue to display. At the same time, the EPD sub-pixel is driven to display in black, and moreover the EPD sub-pixel can be maintained in a black display state without being powered continuously during the continuous color display; of course, the EPD sub-pixel in the pixel unit may display in white.

In other embodiments, if the OLED sub-pixels in the pixel unit are of other three colors other than red, green and blue or more than three colors, the OLED sub-pixels of the other three colors or more than three colors should be driven to display.

S3: if the color to be displayed by the pixel unit is black-and-white, driving the EPD sub-pixel to display. At the same time, the OLED sub-pixels are not driven so that the OLED sub-pixels are in a colorless and transparent state, which will not affect the display of the EPD sub-pixel and things behind the display panel can be seen through the OLED sub-pixels.

Thus, the display panel and the method for driving the display panel provided by the present invention can use the at least one EPD sub-pixel with relatively low power consumption in the pixel unit to display the black-and-white part in the image to be displayed and thus not all of the OLED sub-pixels with relatively high power consumption are required to display the entire image, thereby the power consumption in display is reduced and the current energy-saving requirements on the display panel may be met.

The embodiment of the present invention further provides a display device including the display panel provided by the above embodiment.

The display device provided by the embodiment of the present invention has the same technical features as those of the display panel and the method for fabricating the display panel provided by the embodiment of the present invention, and thus can achieve the same technical advantages and solve the same technical problems.

Preferably, the display device is provided with a light source. Since the EPD sub-pixel cannot emit light by itself, when it is at night or in any other external environment with low light, the display device may use the light source provided thereinside to make the EPD sub-pixels display an image more clearly.

The above are only specific embodiments of the present invention, but the protection scope of the invention is not limited thereto, and persons skilled in the art will readily conceive various modifications or substitutes within the technical range disclosed in the invention, which should fall within the protection scope of the invention. Therefore, the protection scope of the invention should be defined by the claims.

The invention claimed is:

1. A display panel comprising:
    a plurality of pixel units arranged in an array;
    means for determining a color to be displayed by a pixel unit,
    wherein each pixel unit consists of three OLED sub-pixels and one EPD sub-pixel,
    wherein if the color to be displayed by the pixel unit is the same as that of the EPD sub-pixel, driving the EPD sub-pixel to display; otherwise, driving the three OLED sub-pixels to display,
    wherein in the case that each pixel unit of the display panel includes three OLED sub-pixels and one EPD sub-pixel, and the three OLED sub-pixels are a red OLED sub-pixel, a green OLED sub-pixel and a blue OLED sub-pixel, respectively, and the one EPD sub-pixel is a black-and-white EPD sub-pixel, said means for determining a color to be displayed by the pixel unit further includes means for acquiring three gray values of respective red, green and blue components of the color to be displayed by the pixel unit,
    wherein if two of the three gray values are different, determining that the color to be displayed by the pixel unit is a color other than black and white, and
    wherein if all of the three gray values are identical, determining that the color to be displayed by the pixel unit is black-and-white.

2. The display panel of claim 1, wherein the three OLED sub-pixels and the one EPD sub-pixel are arranged in a square or arranged in a straight line.

3. The display panel of claim 2, wherein the three OLED sub-pixels of the pixel unit are a red OLED sub-pixel, a green OLED sub-pixel and a blue OLED sub-pixel respectively; and the one EPD sub-pixel of the pixel unit is a black-and-white EPD sub-pixel.

4. The display panel of claim 1, wherein the OLED sub-pixel includes an anode, a hole transport layer, a light emitting layer, an electron transport layer and a cathode which are stacked sequentially.

5. The display panel of claim 4, wherein at least one of the anode and the cathode is made from a transparent conductive material.

6. The display panel of claim 1, wherein the EPD sub-pixel includes a first electrode, a second electrode and a micro-capsule or a micro-cup disposed between the first electrode and a second electrode.

7. The display panel of claim 1, further including an upper substrate and a lower substrate, wherein the plurality of pixel units arranged in an array are provided between the upper substrate and the lower substrate, and at least one of the upper substrate and the lower substrate is a flexible transparent substrate.

8. The display panel of claim 1, wherein the three OLED sub-pixels of the pixel unit are a red OLED sub-pixel, a green OLED sub-pixel and a blue OLED sub-pixel respectively; and the one EPD sub-pixel of the pixel unit is a black-and-white EPD sub-pixel.

9. A display device, including the display panel of claim 1.

10. The display device of claim 9, further including a light source for supplying light to the at least one EPD sub-pixel when the external light is weak.

11. The display device of claim 10, wherein each pixel unit includes three OLED sub-pixels and one EPD sub-pixel.

12. The display panel of claim 11, wherein the three OLED sub-pixels and the one EPD sub-pixel are arranged in a square or arranged in a straight line.

13. The display panel of claim 12, wherein the three OLED sub-pixels of the pixel unit are a red OLED sub-pixel, a green OLED sub-pixel and a blue OLED sub-pixel respectively; and the one EPD sub-pixel of the pixel unit is a black-and-white EPD sub-pixel.

14. The display panel of claim 11, wherein the three OLED sub-pixels of the pixel unit are a red OLED sub-pixel, a green OLED sub-pixel and a blue OLED sub-pixel respectively; and the one EPD sub-pixel of the pixel unit is a black-and-white EPD sub-pixel.

15. The display panel of claim 9, wherein the OLED sub-pixel includes an anode, a hole transport layer, a light emitting layer, an electron transport layer and a cathode which are stacked sequentially.

16. The display panel of claim 9, wherein the EPD sub-pixel includes a first electrode, a second electrode and a micro-capsule or a micro-cup disposed between the first electrode and a second electrode.

17. A method for driving a display panel having a plurality of pixel units arranged in an array, wherein each pixel unit consists of three OLED sub-pixels and one EPD sub-pixel, the method comprising:
    determining a color to be displayed by a pixel unit; and
    if the color to be displayed by the pixel unit is the same as that of the EPD sub-pixel, driving the EPD sub-pixel to display; otherwise, driving the three OLED sub-pixels to display;
    wherein in the case that each pixel unit of the display panel includes three OLED sub-pixels and one EPD sub-pixel, and the three OLED sub-pixels are a red OLED sub-pixel, a green OLED sub-pixel and a blue OLED sub-pixel, respectively, and the one EPD sub-pixel is a black-and-white EPD sub-pixel, the step of determining a color to be displayed by a pixel unit includes:
    acquiring three gray values of respective red, green and blue components of the color to be displayed by the pixel unit;
    if two of the three gray values are different, determining that the color to be displayed by the pixel unit is a color other than black and white; and
    if all of the three gray values are identical, determining that the color to be displayed by the pixel unit is black-and-white.

18. The method for driving the display panel of claim 17, further including:
- when the color to be displayed by the pixel unit is the color other than black and white, driving the EPD sub-pixel to display in black-and-white while driving the red OLED sub-pixel, the green OLED sub-pixel and the blue OLED sub-pixel to display; and
- when the color to be displayed by the pixel unit is black-and-white, driving the EPD sub-pixel to display without driving the three OLED sub-pixels.

\* \* \* \* \*